(12) United States Patent
Ryu et al.

(10) Patent No.: US 11,310,905 B2
(45) Date of Patent: Apr. 19, 2022

(54) MEMORY DEVICE INCLUDING A CONDUCTIVE PLATE WITH A SHIELDING REGION

(71) Applicant: SAMSUNG ELECTRONICS CO., LTD., Suwon-si (KR)

(72) Inventors: Chung Hyun Ryu, Hwaseong-si (KR); In Sub Kwak, Seoul (KR); Min Woo Gu, Hwaseong-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 0 days.

(21) Appl. No.: 16/822,242

(22) Filed: Mar. 18, 2020

(65) Prior Publication Data

US 2020/0413528 A1 Dec. 31, 2020

(30) Foreign Application Priority Data

Jun. 27, 2019 (KR) .................. 10-2019-0076832

(51) Int. Cl.
*H05K 1/00* (2006.01)
*H05K 1/02* (2006.01)
*H05K 9/00* (2006.01)

(52) U.S. Cl.
CPC ......... *H05K 1/0216* (2013.01); *H05K 1/0203* (2013.01); *H05K 1/0259* (2013.01); *H05K 9/0024* (2013.01); *H05K 2201/066* (2013.01); *H05K 2201/10159* (2013.01); *H05K 2201/10371* (2013.01); *H05K 2201/10522* (2013.01)

(58) Field of Classification Search
CPC .. H05K 1/0216; H05K 1/0203; H05K 1/0259; H05K 9/0024; H05K 2201/066; H05K 2201/10159; H05K 2201/10371; H05K 2201/1052
See application file for complete search history.

(56) References Cited

U.S. PATENT DOCUMENTS

| | | |
|---|---|---|
| 5,045,971 A | 9/1991 | Ono et al. |
| 5,589,711 A | 12/1996 | Sano et al. |
| 6,128,194 A | 10/2000 | Francis |
| 6,233,150 B1 | 5/2001 | Lin et al. |
| 6,430,043 B1 | 8/2002 | Osburn |
| 6,987,671 B2 * | 1/2006 | Houle .................. H01L 23/373 165/185 |
| 7,365,985 B1 | 4/2008 | Ni |
| 7,944,703 B2 | 5/2011 | Ni et al. |
| 8,018,734 B2 | 9/2011 | Brewer et al. |
| 9,317,079 B2 | 4/2016 | Burton |
| 9,552,848 B2 | 1/2017 | Mangay-Ayam, Jr. et al. |
| 9,823,691 B2 * | 11/2017 | Kimura .................. G11C 5/02 |
| 10,010,012 B2 | 6/2018 | Yoo et al. |
| 10,251,257 B2 | 4/2019 | Lai |
| 2004/0180474 A1 * | 9/2004 | Oman .................. H01L 24/73 438/125 |
| 2008/0007914 A1 | 1/2008 | Peng et al. |

(Continued)

*Primary Examiner* — Pete T Lee
(74) *Attorney, Agent, or Firm* — F. Chau & Associates, LLC

(57) ABSTRACT

Provided is a memory device. The memory device includes a module board on which one or more semiconductor devices are disposed and a conductive plate mounted on a first side of the module board. The conductive plate includes a shielding region and a non-shielding region. A pad is disposed in the shielding region of the conductive plate.

17 Claims, 9 Drawing Sheets

(56) References Cited

U.S. PATENT DOCUMENTS

2009/0027859 A1    1/2009  Giacoma
2017/0251569 A9 *  8/2017  Yoo .................... H05K 7/20336
2019/0045674 A1    2/2019  Liang

* cited by examiner

1

MEMORY DEVICE INCLUDING A CONDUCTIVE PLATE WITH A SHIELDING REGION

This application claims priority under 35 U.S.C. § 119 to Korean Patent Application No. 10-2019-0076832 filed on Jun. 27, 2019 in the Korean Intellectual Property Office, the disclosure of which is incorporated by reference herein in its entirety.

1. Technical Field

The present disclosure relates to a memory device, and more particularly, to a memory device including a conductive plate with a shielding region.

2. Discussion of the Related Art

In order to improve heat dissipation characteristics of a memory device having a module form (e.g., a solid state drive (SSD) that complies with a M.2 specification), it is common practice to use a thermal interface material (TIM) in the form of a solid or a liquid, or to attach a heat sink made of a metal material. However, as an operating speed of the memory device increases and a usage voltage decreases, electrostatic discharge (ESD) characteristics in the memory device having the module form may degrade or damage electronic components in the memory device.

SUMMARY

According to an exemplary embodiment of the present disclosure, provided is a memory device. The memory device includes a module board on which one or more semiconductor devices are disposed and a conductive plate mounted on a first side of the module board. The conductive plate includes a shielding region and a non-shielding region. A pad is disposed in the shielding region of the conductive plate.

According to an exemplary embodiment of the present disclosure, provided is a memory device. The memory device includes a module board on which a memory controller is disposed and a conductive back plate mounted on a first side of the module board. The conductive back plate includes a shielding region and a non-shielding region, and the semiconductor device is disposed in the shielding region.

According to an exemplary embodiment of the present disclosure, provided is a memory device. A memory device is provided including a module board on which one or more semiconductor devices are disposed and a conductive plate mounted on a first side of the module board. The conductive plate includes a shielding wall structure formed on the conductive plate.

BRIEF DESCRIPTION OF THE DRAWINGS

The above and other features of the present disclosure will become more apparent by describing in detail exemplary embodiments thereof with reference to the attached drawings, in which.

DETAILED DESCRIPTION OF THE EMBODIMENTS

Figure 1:
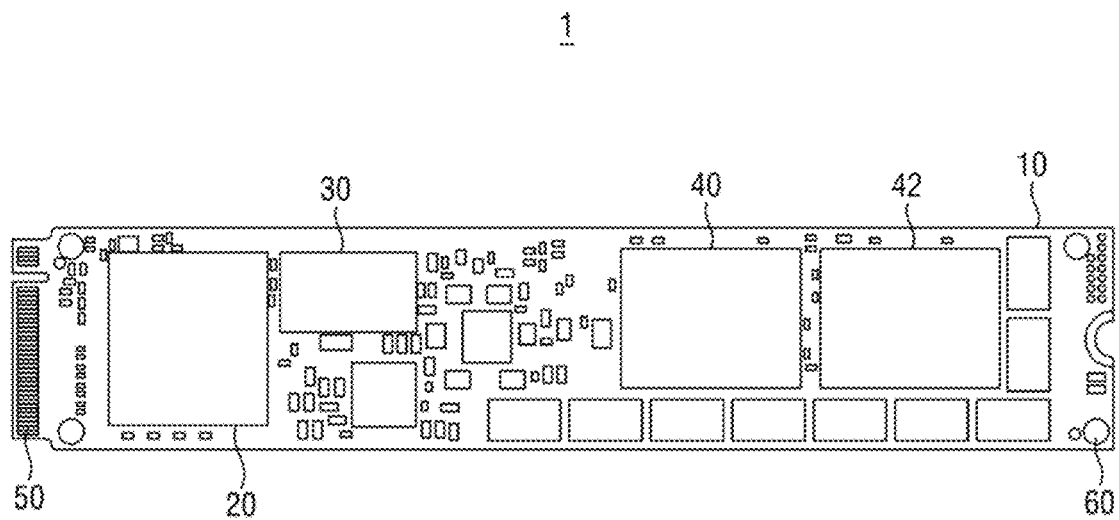
FIG. 1 is a plan view illustrating a first side of a module board of a memory device according to an exemplary embodiment of the present disclosure.
Figure 2:
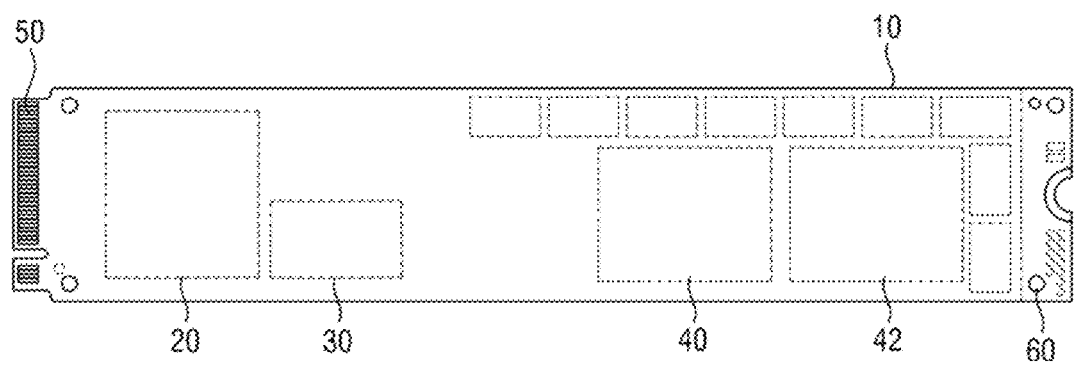
FIG. 2 is a plan view illustrating a second side of the module board of the memory device according to the exemplary embodiment of the present disclosure.

FIG. 1 is a plan view illustrating a first side of a module board of a memory device according to an exemplary embodiment of the present disclosure. FIG. 2 is a plan view illustrating a second side of the module board of the memory device according to the exemplary embodiment of the present disclosure.

Referring to FIGS. 1 and 2, a module board 10 of a memory device 1 according to an exemplary embodiment of the present disclosure may include a memory controller 20, a buffer memory 30, nonvolatile memories 40 and 42, a connector 50 and a coupling hole 60. For convenience of description and illustration, exemplary embodiments of the present disclosure will be described on the basis of the layout of the memory device 1 shown in FIG. 1. However, the scope of the present disclosure is not limited thereto. For example, constituent elements of the memory device 1 may be omitted and/or additional components may be added to the memory device 1, and the arrangement and size of the constituent elements of the memory device 1 may be variously changed.

According to the exemplary embodiment of the present disclosure depicted in FIGS. 1 and 2, the memory device 1 may be an SSD. The SSD may replace a hard drive used in a personal computer (PC), a notebook computer and the like. Further, the SSD may also be used in mobile devices, such as a smartphone, a tablet PC, a digital camera, a MP3 player, and a PDA. Although the memory device 1 may be an SSD that complies with the M.2 specification, the scope of the present disclosure is not limited thereto, various memory devices of different specifications may be included.

The module board 10 may be a single layer or a multilayer circuit board having an upper face and a lower face opposite to each other. For example, the upper face and the lower face may be parallel planar surfaces of the module board 10. The module board 10 may be, for example, a printed circuit board. One or more semiconductor devices are disposed on the module board 10 (e.g., the upper face). The module board 10 may include wirings formed on a planar surface or inside the module board 10, and vias for connecting the wirings. These wirings may be printed circuit patterns for interconnecting one or more semiconductor devices disposed on the module board 10.

Although the module board 10 may be designed to comply with the M.2 specification and have a rectangular shape, the scope of the present disclosure is not limited thereto. As previously mentioned, the module board 10 may comply with various specifications and may be formed in many different shapes.

The memory controller 20 is disposed on one side of the module board 10 to generally control the memory device 1. For example, the module board 10 may have a rectangular shape in a plan view including parallel pairs of short and long sides, and the memory controller 20 may be disposed at an edge portion of a short side (e.g., a first short side). The memory controller 20 may be an SSD controller. In this case, the memory controller 20 may transmit and receive electrical signals to and from a host device that controls the memory device 1, through interfaces such as a universal serial bus (USB), a small computer system interface (SCSI), a peripheral component interconnect express (PCI express), an Advanced Technology Attachment (ATA), a Parallel ATA (PATA), a Serial ATA (SATA), and a Serial Attached SCSI (SAS). The electric signals transmitted and received between the memory controller 20 and the host device may include a command, an address, data, and the like. Further, the memory controller 20 may analyze and process the electrical signal received from the host device.

The buffer memory 30 is disposed on one side of the module board 10 (e.g., at an edge portion of a long side adjacent to an inner side surface of the memory controller 20), and may be used as a buffer region which temporarily stores data transmitted from the host device or temporarily reads data read from the nonvolatile memory devices 40 and 42. Further, the buffer memory 30 may also be used to drive software or programs that are used for management for the nonvolatile memory devices 40 and 42. Further, the buffer memory 30 may be used to store metadata input from the host device or store the cache data.

The buffer memory 30 may include one or more dynamic random access memory (DRAM) packages. The DRAM package may include a package substrate and at least one DRAM chip mounted on the package substrate. Alternatively, the buffer memory 30 may include a static random access memory (SRAM), or may include a nonvolatile memory such as a NAND flash memory, a phase change random access memory (PRAM), a magnetic random access memory (MRAM), a resistive random access memory (RRAM or ReRAM), and a ferroelectric random access memory (FRAM).

The nonvolatile memories 40 and 42 may be disposed on one side of the module board 10. For example, the nonvolatile memory 42 may have an outer side disposed adjacent to a second short side of the module board 10 and an inner side disposed adjacent to an outer side of the nonvolatile memory 41. However, the scope of the present disclosure is not limited thereto, and a nonvolatile memory 41 or 42 or an additional nonvolatile memory may be disposed nearer to the first short side of the module board 10 than the second short side.

The nonvolatile memories 40 and 42 may be used as data storage spaces of the memory device 1. The nonvolatile memories 40 and 42 may be connected to the memory controller 20 through at least one channel. The nonvolatile memories 40 and 42 may include a NAND flash memory, however, the scope of the present disclosure is not limited thereto. Alternatively, the nonvolatile memories 40 and 42 may include a nonvolatile memory such as be a phase change random access memory (PRAM), a magnetic random access memory (MRAM), a resistive random access memory (RRAM or ReRAM), and a ferroelectric random access memory (FRAM).

The connector 50 is provided on one side part of the module board 10. For example, the connector 50 may be formed across an edge of the first short side. The memory controller 20 may be disposed between the connector 50 and the second short side of the module board 10. The connector 50 includes a plurality of connection terminals for electrically connecting the host device that controls the memory device 1 and the module board 10. The connector 50 is inserted into a socket formed on the board of the host device, and thus, the connection terminal of the module board 10 is electrically connected to the host device. Thus, the host device and the memory device 1 may transmit and receive data from each other.

Figure 3:
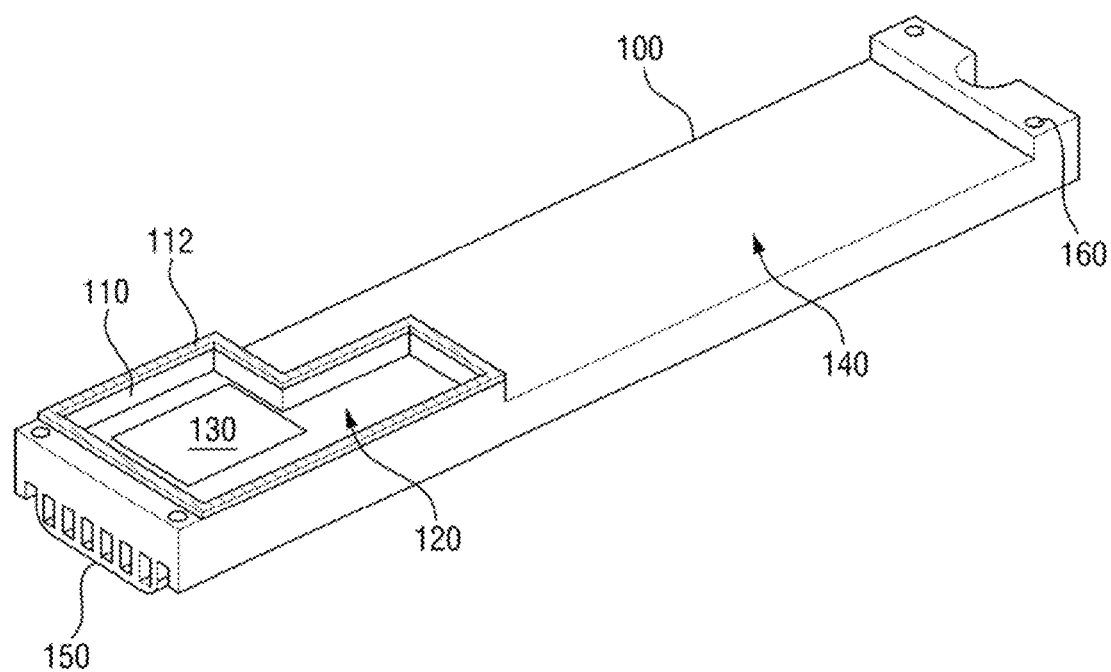
FIG. 3 is a perspective view illustrating a conductive plate of the memory device according to the exemplary embodiment of the present disclosure.
Figure 5:
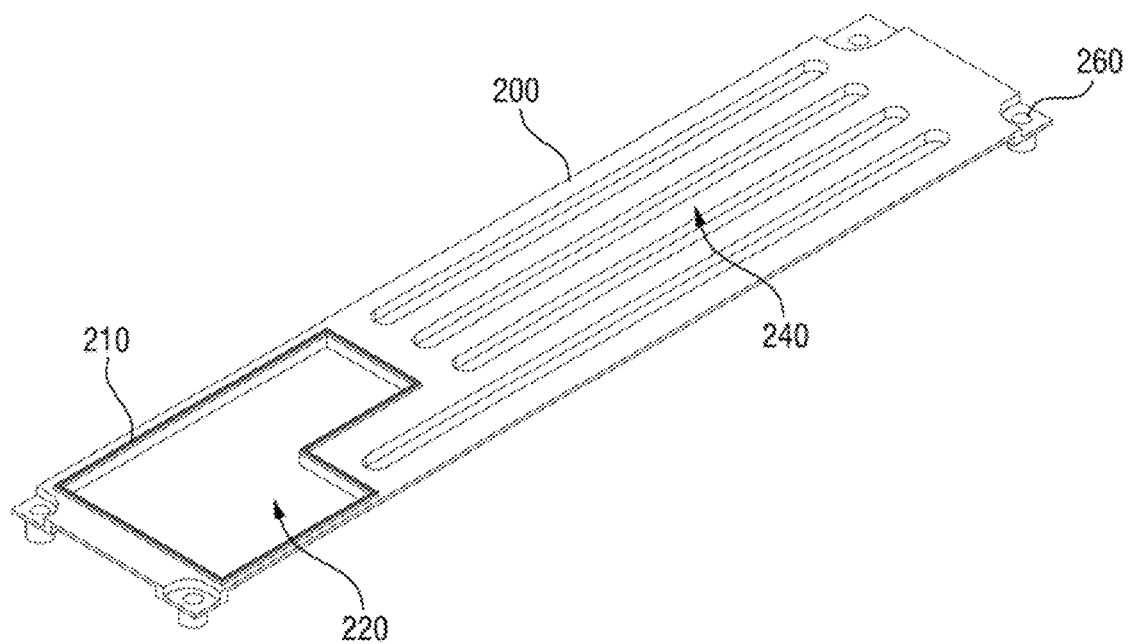
FIG. 5 is a perspective view illustrating a conductive back plate of the memory device according to the exemplary embodiment of the present disclosure.

The coupling hole 60 provides the module board 10 with a space into which a fastening means, such as a fixing bolt, may be inserted to fix a conductive plate 100 or a conductive back plate 200 to the module board 10 (Shown in FIGS. 3 and 5, respectively). For example, the coupling hole 60 may be disposed at corners where orthogonal short sides and long sides connect.

Further, the module board 10 may further include a power management integrated circuit (PMIC) for managing power of one or more semiconductor devices disposed on the module board 10.

Figure 4:
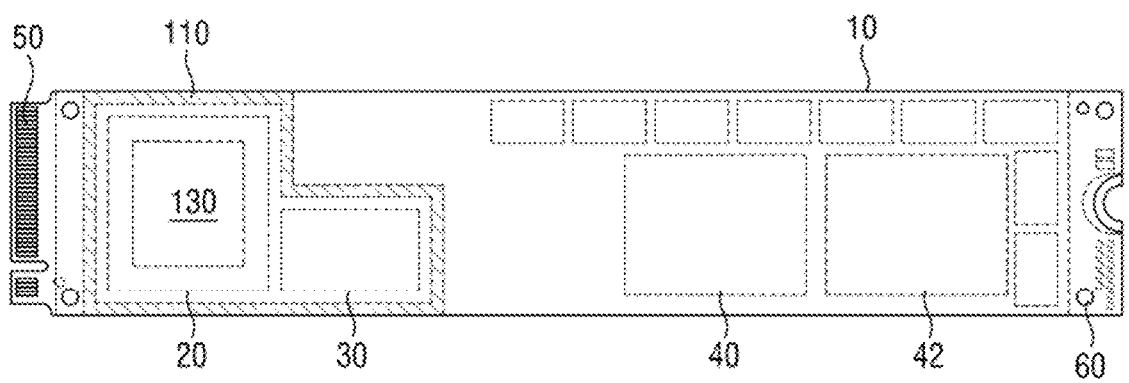
FIG. 4 is a plan view illustrating an example in which the conductive plate is mounted on the module board of the memory device according to the exemplary embodiment of the present disclosure.

FIG. 3 is a perspective view illustrating the conductive plate of the memory device according to an exemplary embodiment of the present disclosure. FIG. 4 is a plan view illustrating an example in which a conductive plate is mounted on the module board of the memory device according to an exemplary embodiment of the present disclosure.

Referring to FIGS. 3 and 4, the conductive plate 100 of the memory device 2 according to an exemplary embodiment of the present disclosure may be mounted on one side (e.g., the upper face) of the module board 10. For example, the conductive plate 100 may include a metal having a high thermal conductivity. For example, the conductive plate 100 may include aluminum or an aluminum alloy. The conductive plate 100 may thermally contact one side (e.g., the upper face) of the module board 10 and emit heat generated from the module board 10 to the outside.

The conductive plate 100 may include a shielding region 120 and a non-shielding region 140. The shielding region 120 corresponds to a region in which semiconductor devices for electrostatic discharge (ESD) shielding are disposed, and the non-shielding region 140 corresponds to a remaining region of the conductive plate 100 other than the shielding region 120. For example, the shielding region 120 may have a rectilinear shape including a square portion and an integrated rectangular portion extending from the square portion. The square portion may have a substantially same width as a width of the conductive plate 100, and the rectangular portion may have a width smaller than a width of the square portion. A side of the rectangular portion may extend in parallel to a side of the square portion, both of which may be disposed along a partial edge of a long side of the conductive plate 100.

The conductive plate 100 includes a shielding wall structure 110 formed on the conductive plate 100. The shielding wall structure 110 may be formed to protrude from the conductive plate 100 (e.g., in a direction normal to an upper surface of the conductive plate 100, or a thickness direction). The shielding region 120 and the non-shielding region 140 of the conductive plate 100 may be separated by the shielding wall structure 110. For example, the perimeter of the shielding region 120 may be defined by the shape of the shielding wall structure 110.

Further, the shielding wall structure 110 may further include a shielding wall contact portion 112 disposed on an upper surface of the shielding wall structure 10. For example, the shielding wall contact portion 112 may be formed such that one side thereof is in direct contact with the module board 10. The shielding wall contact portion 112 may have a shape in which one side thereof surrounds at least a part of one or more semiconductor devices disposed on the module board 10.

However, the scope of the present disclosure is not limited thereto, and the shapes of the shielding wall structure 110 and the shielding wall contact portion 112 may be variously changed to accommodate semiconductor devices of different sizes, shapes and arrangements on the module board 10.

When one or more semiconductor devices disposed on the module board 10 include the memory controller 20, the memory controller 20 may be disposed on one side of the module board 10 (e.g. the upper face) so as to be included in the shielding region 120 of the conductive plate 100.

For example, the memory controller 20 may be disposed on one side (e.g., a left side) of the module board 10 so as to be included inside the shielding wall structure 110 of the conductive plate 100. When one or more semiconductor devices disposed on the module board 10 include the buffer memory 30, the buffer memory 30 may be disposed on the one side (e.g., the left side) of the module board 10 so as to be included in the shielding region 120 of the conductive plate 100.

For example, the buffer memory 30 may be disposed on one side (e.g., the left side) of the module board 10 so as to be included inside the shielding wall structure 110 of the conductive plate 100. For example, the rectangular portion of the shielding region 120 may overlap the buffer memory 30 and the memory controller 20 in a thickness direction.

When one or more semiconductor devices disposed on the module board 10 include the nonvolatile memories 40 and 42, the nonvolatile memories 40 and 42 may be disposed on one side of the module board 10 so as to be included in the non-shielding region 140 of the conductive plate 100.

For example, the nonvolatile memories 40 and 42 may be disposed on one side of the module board 10 so as to be included outside the shielding wall structure 110 of the conductive plate 100.

The pad 130 may be disposed in the shielding region 120 of the conductive plate 100. For example, the pad 130 may be embedded in the shielding region 120 including an exposed first surface substantially coplanar therewith, or may have the exposed first surface elevated with respect to a planar surface of the shielding region 120. The pad 130 may include an electromagnetic interference (EMI) absorbing material and/or a thermal interface material (TIM). The EMI absorbing material corresponds to a material for electrostatic discharge (ESD) shielding of one or more semiconductor devices disposed on the module board 10, and the thermal interface material corresponds to a material used for heat dissipation of the module board 10.

According to an exemplary embodiment of the present disclosure, if one or more semiconductor devices disposed on the module board 10 include a memory controller 20, the pad 130 may be formed at a position corresponding to the memory controller 20 on the conductive plate 100. In particular, one side (e.g., a first side) of the pad 130 may be in direct contact with the memory controller 20, and the other side (e.g., a second side) of the pad 130 may be in direct contact with the conductive plate 100.

For example, the pad 130 is disposed inside the shielding wall structure 110, one side of the pad 130 is in direct contact with the memory controller 10, and the other side of the pad 130 may be in direct contact with the conductive plate 100.

According to an exemplary embodiment of the present disclosure, one side (e.g., the first side) of the pad 130 is not in contact with the memory controller 20, but the other side (e.g., the second side) of the pad 130 is in direct contact with the conductive plate 100. This exemplary embodiment will be described in more detail later on herein.

When one or more semiconductor devices disposed on the module board 10 include the buffer memory 30, the pad 130 may not be formed at a position corresponding to the buffer memory 30 on the conductive plate 100. For example, the buffer memory 30 may be disposed in the rectangular portion of the shielding region 120.

However, the scope of the present disclosure is not limited thereto, and additional pads may be formed at positions corresponding to the buffer memory 30 depending on the specific implementation purpose.

The conductive plate 100 may further include a heat dissipation structure 150 for heat dissipation of the module board 10. The heat dissipation structure 150 may include, for example, a plurality of heat dissipation fins, and the plurality of heat dissipation fins may serve to provide a larger surface area with the surrounding environment, making heat dissipation more effective. However, the form of the heat dissipation structure 150 is not limited to the heat dissipation fin, and the heat dissipation structure 150 may be implemented to have an arbitrary structure for increasing the heat dissipation surface area.

The conductive plate 100 may further include a coupling hole 160 used for fixing to the module board 10, using a fastening means, such as a fixing bolt. The coupling hole 160 may overlap the coupling hole 60 of the module board 10 in the thickness direction.

With such a conductive plate 100 according to an exemplary embodiment of the present disclosure, it is possible not only to effectively increase the ESD characteristics in a memory device having a module form but also to increase the heat dissipation characteristics.

Figure 6:
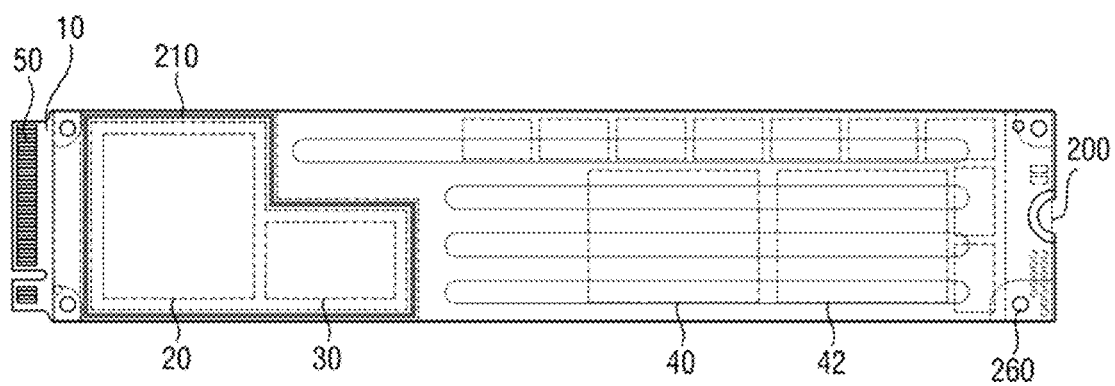
FIG. 6 is a perspective view illustrating an example in which the conductive back plate is mounted on the module board of the memory device according to the exemplary embodiment of the present disclosure.

FIG. 5 is a perspective view illustrating a conductive back plate of the memory device according to an exemplary embodiment of the present disclosure. FIG. 6 is a plan view illustrating an example in which a conductive back plate is mounted on the module board of the memory device according to an exemplary embodiment of the present disclosure.

Referring to FIGS. 5 and 6, the conductive back plate 200 of the memory device 3 according to an exemplary embodiment of the present disclosure may be mounted on the other side (e.g., the lower face) of the module board 10. The conductive back plate 200 may include a metal having a high thermal conductivity. For example, the conductive back plate 200 may include aluminum or an aluminum alloy. The conductive back plate 200 may thermally come into contact with the other side (e.g., the lower face) of the module board 10 to emit heat generated from the module board 10 to the outside.

The conductive back plate 200 may include a shielding region 220 and a non-shielding region 240. The shielding region 220 corresponds to a region in which a semiconductor device for ESD shielding is disposed, and the non-shielding region 240 corresponds to the remaining region of the conductive back plate 200 other than the shielding region 220.

In this exemplary embodiment of the present disclosure, the conductive back plate 200 includes a shielding wall structure 210 formed on the conductive back plate 200. The shielding wall structure 210 may be formed to be recessed from a surface of the conductive back plate 200. The shielding region 220 and the non-shielding region 240 of the conductive back plate 200 may be divided by a shielding wall structure 210. For example, an upper surface of the wall structure 210 may be coplanar with an upper surface of the conductive back plate 200, and a planar surface of the shielding region 220 may be disposed inside the conductive back plate 200 between the upper surface and a lower surface of the conductive back plate 200.

Further, the shielding wall structure 210 may include a shielding wall contact portion. The shielding wall contact portion may be formed such that one side thereof is in direct contact with the module board 10. For example, the shielding wall contact portion may have a shape in which one side thereof surrounds at least a part of one or more semiconductor devices disposed on the module board 10.

However, the scope of the present disclosure is not limited thereto, and the shapes of the shielding wall structure 210 and the shielding wall may be variously changed to accommodate semiconductor devices of different sizes, shapes and arrangements on the module board 10.

When one or more semiconductor devices disposed on the module board 10 include the memory controller 20, the memory controller 20 may be disposed on one side (e.g., a left side) of the module board 10 so as to be included in the shielding region 220 of the conductive back plate 200.

For example, the memory controller 20 may be disposed on one side of the module board 10 (e.g., the left side) so as to be included inside the shielding wall structure 210 of the conductive back plate 200.

When one or more semiconductor devices disposed on the module board 10 include the buffer memory 30, the buffer memory 30 may be disposed on the one side (e.g., the left side) of the module board 10 so as to be included in the shielding region 220 of the conductive back plate 200.

For example, the buffer memory 30 may be disposed on one side (e.g., the left side) of the module board 10 so as to be included in the enclosed shielding wall structure 210 of the conductive back plate 200.

When one or more semiconductor devices disposed on the module board 10 include the nonvolatile memories 40 and 42, the nonvolatile memories 40 and 42 may be disposed on one side (e.g., the right side) of the module board 10 so as to be included in the non-shielding region 240 of the conductive back plate 200.

For example, the nonvolatile memories 40 and 42 may be disposed on one side (e.g., the right side) of the module board 10 so as to be included outside the shielding wall structure 210 of the conductive back plate 200.

The conductive back plate 200 may further include a coupling hole 260 used for fixing to the module board 10, using a fastening means, such as a fixing bold. For example, the coupling hole 260 may overlap the coupling hole 60 of the module board 10 in the thickness direction.

With the conductive back plate 200 according to an exemplary embodiment of the present disclosure, it is possible to not only effectively increase the ESD characteristics in the memory device having the module form but also to increase the heat dissipation characteristics.

The conductive plate 100 of FIG. 3 and the conductive back plate 200 of FIG. 4 may be used together or may be used separately. That is, the conductive plate 100 may be mounted on one side (e.g., the upper face) of the module board 10, and the conductive back plate 200 may be mounted on the other side (e.g., the lower face) of the module board 10. According to an exemplary embodiment of the present disclosure, the conductive plate 100 may be mounted on one side (e.g., the upper face) of the module board 10, and the conductive back plate 200 may not be mounted on the other side (e.g., the lower face) of the module board 10. According to an exemplary embodiment of the present disclosure, the conductive back plate 200 may be mounted on one side (e.g., the upper face) of the module board 10, and the conductive plate 100 may not be mounted on the other side (e.g., the lower face) of the module board 10.

When the conductive plate 100 of FIG. 3 and the conductive back plate 200 of FIG. 4 are used together, the shielding wall structure of the conductive back plate 200 may be formed to correspond to the shielding wall structure 110 of the conductive plate 100. For example, the shielding wall structure of the conductive back plate 200 may be formed in a shape corresponding to that of the shielding wall structure 110 of the conductive plate 100 or may be formed at a corresponding position even if the shape is slightly different.

With the conductive plate 100 or the conductive back plate 200 according to an exemplary embodiment of the present disclosure described above, the ESD characteristics can be effectively increased in the memory device having the form of a module, and the heat dissipation characteristics can also be increased.

FIGS. 7 to 11 are side view illustrating an arrangement relationship between a semiconductor element and a conductive plate disposed on a module board of the memory device according to an exemplary embodiment of the present disclosure.

Hereinafter, although the memory controller 20 described above will be described as an example of the semiconductor element disposed on the module board 10, the present disclosure is not limited thereto. Further, in the following description, although an example in which the pad 130 of the conductive plate 100 is disposed on the memory controller 20 will be described as an example, the present disclosure is not limited thereto.

Figure 7:
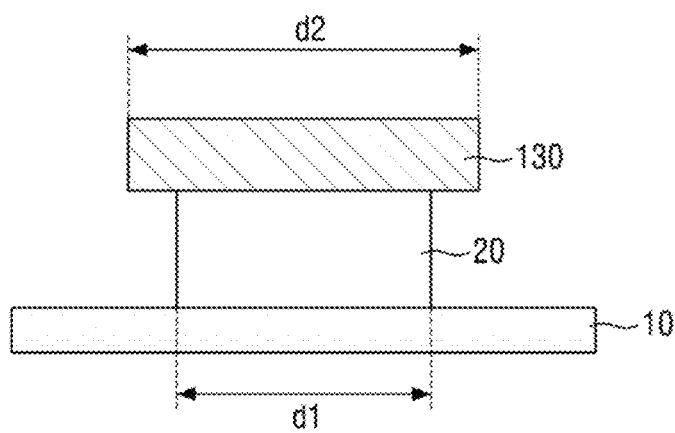
FIGS. 7 to 11 are side views illustrating an arrangement relationship between a semiconductor element and a conductive plate disposed on the module board of the memory device according to an exemplary embodiment of the present disclosure.

Referring to FIG. 7, the pad 130 may be disposed on the memory controller 20 disposed on the module board 10. The pad 130 may be disposed to cover the memory controller 20 as much as possible to maximize the ESD shielding effect.

According to an exemplary embodiment of the present disclosure, a width d2 of the pad 130 may have a range of 0.9× to 1.5× a width d1 of the memory controller 20. When the width d2 of the pad 130 has the range of 0.9× or more of the width d1 of the memory controller 20, a significant ESD shielding effect may be generated, and when the width d2 of the pad 130 has the range of 1.5× or less of the width d1 of the memory controller 20, it is possible to prevent the pad 130 from sagging in a direction of the module board 10.

Figure 8:
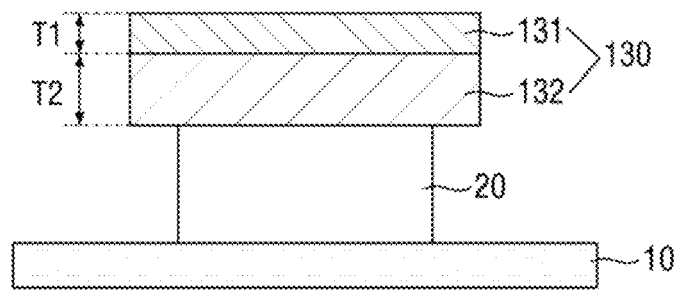

Next, referring to FIG. 8, the pad 130 may include an EMI absorption layer 131 and a TIM layer 132.

According to an exemplary embodiment of the present disclosure, the EMI absorption layer 131 may be disposed on the TIM layer 132. For example, the TIM layer 132 and the EMI absorption layer 131 may be sequentially disposed on the memory controller 20.

A thickness T1 of the EMI absorption layer 131 and a thickness T2 of the TIM layer 132 may be implemented with various modifications, depending on which performance of the ESD shielding performance and the thermal interface performance of the pad 130 is weighted. In an exemplary embodiment of the present disclosure, the thickness T1 of the EMI absorption layer 131 may be formed to be smaller than the thickness T2 of the TIM layer 132, as shown.

Figure 9:
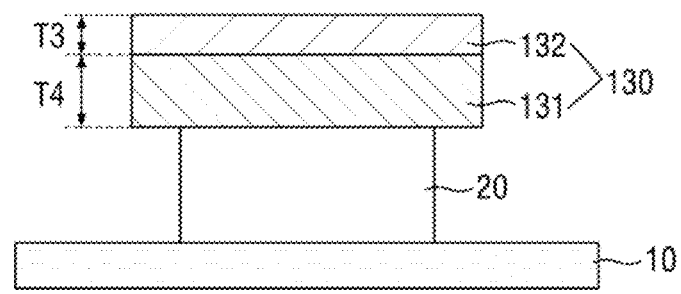

Next, referring to FIG. 9, the EMI absorption layer 131 and the TIM layer 132 may be formed so that the order thereof changes. Specifically, the TIM layer 132 may be disposed on the EMI absorption layer 131. For example, the EMI absorption layer 131 and the TIM layer 132 may be sequentially disposed on the memory controller 20. The arrangement of the EMI absorption layer 131 and the TIM layer 132 may also be implemented with various modifications depending on prioritization of the ESD shielding or the thermal interface of the pad 130. According to an exemplary embodiment of the present disclosure, the thickness T4 of the EMI absorption layer 131 may be formed to be greater than the thickness T3 of the TIM layer 132, as shown.

Figure 10:
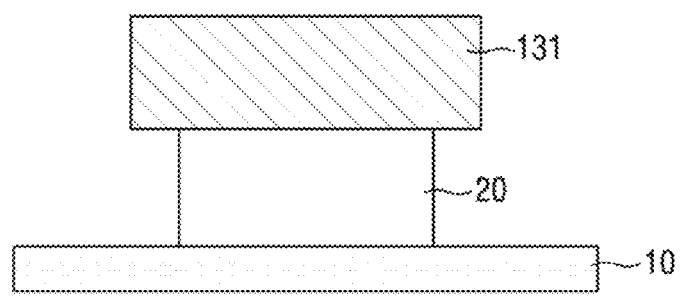

Next, referring to FIG. 10, the pad 130 may be made up of only of the EMI absorption layer 131. For example, the TIM layer 132 is not provided and only the EMI absorption layer 131 is disposed on the memory controller 20 as the pad 130.

Figure 11:
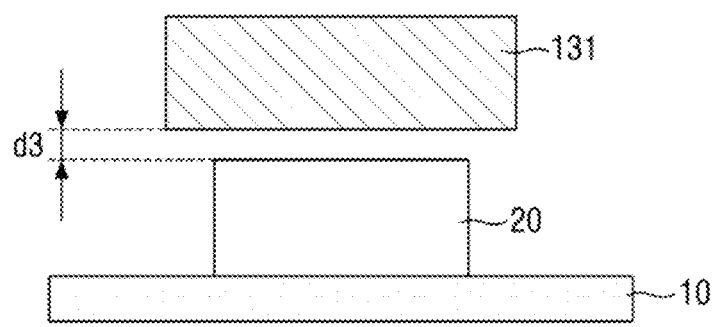

Next, referring to FIG. 11, the EMI absorption layer 131 may be disposed without being in contact with the memory controller 20. For example, the pad 130 made up of the EMI absorption layer 131 is fixed to one side of the conductive plate 100, and may be disposed on the memory controller 20 with a predetermined gap d3 formed from the memory controller 20. For example, the EMI absorption layer 131 may be disposed on the memory controller 20 with the predetermined gap d3 formed between the lower face of the EMI absorption layer 131 and the upper face of the memory controller 20.

While exemplary embodiments of the present disclosure have been described with reference to the figures, it will be understood by those of ordinary skill in the art that various changes in form and details may be made therein without departing from the spirit and scope of the present disclosure as defined by the following claims.

What is claimed is:

1. A memory device, comprising:
    a module board on which one or more semiconductor devices are disposed;
    a conductive plate mounted on a first side of the module board, wherein the conductive plate includes a shielding region and a non-shielding region; and
    a pad disposed in the shielding region of the conductive plate, the pad is configured for electrostatic discharge shielding,
    wherein the one or more semiconductor devices include a memory controller, and
    wherein the memory controller is disposed on the first side of the module board in the shielding region,
    wherein a first side of the pad is in direct contact with the memory controller and second side of the pad is in direct contact with the conductive plate.

2. The memory device of claim 1, wherein the conductive plate includes a first shielding wall structure formed on the conductive plate, and
    wherein the shielding region and the non-shielding region are divided by the first shielding wall structure.

3. The memory device of claim 2, wherein the first shielding wall structure includes a shielding wall contact portion formed so that a first side of the shielding wall contact portion is in direct contact with the module board, and
    wherein the shielding wall contact portion at least partially surrounds the one or more semiconductor devices.

4. The memory device of claim 2, further comprising:
    a conductive back plate mounted on a second side of the module board,
    wherein the conductive back plate further includes a second shielding wall structure formed to overlap the first shielding wall structure.

5. The memory device of claim 1, wherein the pad is formed at a position at least partially overlapping the memory controller on the conductive plate.

6. The memory device of claim 1, wherein the one or more semiconductor devices include a buffer memory and a nonvolatile memory, and
    wherein the buffer memory is included in the shielding region, and the nonvolatile memory is included in the non-shielding region.

7. The memory device of claim 1, wherein the pad includes an electromagnetic interference (EMI) absorption layer for electrostatic discharge (ESD) shielding of the one or more semiconductor devices, and a thermal interface material (TIM) layer for heat dissipation of the module board.

8. The memory device of claim 7, wherein the pad includes:
    the TIM layer having a first thickness, and
    the EMI absorption layer disposed on the TIM layer and having a second thickness smaller than the first thickness.

9. The memory device of claim 7, wherein the pad includes:
    the EMI absorption layer having a first thickness, and
    the TIM layer disposed on the EMI absorption layer and having a second thickness smaller than the first thickness.

10. The memory device of claim 7, wherein the EMI absorption layer is disposed on the one or more semiconductor devices with a predetermined gap comprised of empty space formed between a lower face of the EMI absorption layer and an upper face of the one of more semiconductor devices.

11. The memory device of claim 1, wherein the pad has a width in a range of 0.9x to 1.5x a width of the one or more semiconductor devices.

12. A memory device, comprising:
    a module board on which a memory controller is disposed; and
    a conductive back plate mounted on a first side of the module board,
    wherein the conductive back plate includes a shielding region and a non-shielding region, the shielding region including a first material configured for electrostatic discharge shielding, and
    wherein the memory controller is disposed in the shielding region and overlaps the first material,
    wherein a first side of the first material is in direct contact with the memory controller and a second side of the first material is in direct contact with the conductive back plate.

13. The memory device of claim 12, wherein a buffer memory and a nonvolatile memory are further disposed on the module board, and
    wherein the buffer memory is disposed in the shielding region, and the nonvolatile memory is disposed in the non-shielding region.

14. The memory device of claim 12, wherein the shielding region is recessed from a surface of the conductive back plate.

15. A memory device, comprising:
a module board on which one or more semiconductor devices are disposed; and
a conductive plate mounted on a first side of the module board,
wherein the conductive plate includes a shielding wall structure formed on the conductive plate,
wherein a first material configured for electrostatic discharge shielding is disposed inside the shielding wall structure,
wherein the one or more semiconductor devices include a memory controller, and
the memory controller is disposed on the first side of the module board and is inside the shielding wall structure,
wherein a pad including the first material is disposed inside the shielding wall structure, and
wherein a first side of the pad is in direct contact with the memory controller, and a second side of the pad is in direct contact with the conductive plate.

16. The memory device of claim 15, wherein the one or more semiconductor devices include a buffer memory, and
wherein the buffer memory is disposed within the shielding wall structure on the first side of the module board.

17. The memory device of claim 1, wherein:
the shielding region and the non-shielding region are divided from each other;
a memory controller and a buffer memory are disposed in the shielding region; and
the pad is disposed in only a partial portion of the shielding region,
wherein the pad overlaps the memory controller and the pad does not overlap the buffer memory.

* * * * *